United States Patent [19]

Levy

[11] Patent Number: 5,130,645

[45] Date of Patent: Jul. 14, 1992

[54] INTEGRATED CIRCUIT BUILT-IN SELF-TEST STRUCTURE

[75] Inventor: Paul S. Levy, Chandler, Ariz.

[73] Assignee: VLSI Technology, Inc., San Jose, Calif.

[21] Appl. No.: 566,942

[22] Filed: Aug. 13, 1990

[51] Int. Cl.⁵ ............................................. G01R 31/28
[52] U.S. Cl. ................................. 324/158 R; 371/22.1
[58] Field of Search .............. 324/158 R, 158 T, 73.1; 371/22.1, 22.5, 22.6

[56] References Cited

U.S. PATENT DOCUMENTS

| | | | |
|---|---|---|---|
| 4,336,495 | 6/1982 | Hapke | 324/158 T |
| 4,686,627 | 8/1987 | Donovan et al. | 324/73.1 |
| 4,743,841 | 5/1988 | Takeuchi | 324/158 R |
| 4,970,454 | 11/1990 | Stambaugh et al. | 324/73.1 |

Primary Examiner—Ernest F. Karlsen
Attorney, Agent, or Firm—LaValle D. Ptak

[57] ABSTRACT

A built-in, self-test structure for the circuit components of an integrated circuit chip is isolated from the chip circuitry and the operating power supply and power supply interconnections of the chip, so that it appears as an open circuit during normal operation of the chip. The self-test structure includes separate power supply leads for connection to a separate test power supply which is employed to both enable and operate the circuit in the test mode. The test input are multiplexed on the test power supply leads while test power is applied thereto. Whenever the test power is removed, the test circuit automatically powers down and disconnects, essentially becoming invisible to the normal operation of the circuit. If short circuits or circuit opens should occur in the test structures, the reliability of the operation of the integrated circuit device itself is unaffected, since the test circuit structures are isolated from the operating circuit components of the integrated circuit chip.

6 Claims, 2 Drawing Sheets

INTEGRATED CIRCUIT BUILT-IN SELF-TEST STRUCTURE

BACKGROUND

It is important to have the ability to perform a variety of test operations on integrated circuits prior to incorporating such circuits into completed devices. On some occasions, it also is important to be able to test integrated circuits for circuit failures, open circuits, short circuits and the like, even after such integrated circuits have been interconnected with other components in an electronic device. Testing of such circuits becomes increasingly important, and increasingly difficult, as the density of the circuit components and circuitry on the wafer chip or substrate increases. It is extremely important to know in advance of the incorporation of such an integrated circuit component into a finished device that the component is capable of its anticipated operation.

On a typical integrated circuit chip, additional test circuitry must be incorporated into the chip to permit the testing function. Typically, this additional test circuitry occupies between five and fifteen percent of the total chip area; and the test circuitry can interfere with the operation of the integrated circuit device itself if a failure in the test circuitry occurs. Normally, the test circuitry is provided with power through the operating power supply for the chip itself; so that if there is a failure in the test circuitry during subsequent operation of the integrated circuit components of the system of the chip, the test circuitry failure can cause the targeted device or circuit component also to fail. Even if no failure of the test circuitry occurs, there is a constant power drain from the operating power supply by the test circuitry, since it is not isolated from the power supply. Since there is no separation of the normal power supply from the test circuitry power supply, the entire integrated circuit system is powered up during the time of the test mode, whenever the test mode is enabled. As a consequence, access and isolation of the target device for the test mode from the normal operating mode of the circuit, cannot be accomplished.

As demands made for higher fault grade silicon integrated circuits increase, the percentage of test circuitry to the function circuitry also increases. It is important that the test circuitry does not enter into the reliability consideration of the function circuitry, but this is not possible when the test structures are not dormant, that is, when the test structures are powered up by the operating power supply for the function circuitry.

Accordingly, it is desirable to provide a built-in, self-test structure for an integrated circuit wafer which provides access and isolation of the target design, and which is isolated from the host or function circuit on the wafer when it is not in use.

SUMMARY OF THE INVENTION

Accordingly, it is an object of this invention to provide an improved self-test structure for an integrated circuit wafer.

It is another object of this invention to provide an improved test structure for an integrated circuit wafer which self-isolates from the host circuit on the wafer.

It is an additional object of this invention to provide an improved test structure for an integrated circuit wafer, utilizing a secondary separate power supply for the test structures which is isolated from the operating power supply for the function circuits of the wafer.

It is a further object of this invention to provide a built-in, self-test structure for an integrated circuit wafer where the test structure is accessed by a secondary test power supply to provide power to the test structures with multiplexing of the input and output test signals on the same structures used to provide power during the test mode of operation.

It is yet another object of this invention to increase the overall device reliability of an integrated circuit by the elimination of active test circuitry during normal operation of the integrated circuit.

In accordance with a preferred embodiment of the invention, a built-in, self-test structure for an integrated circuit wafer chip automatically powers down and disconnects when the test operation is not being effected. This is accomplished by utilizing a separate, secondary test power supply voltage source to provide operating power during the test mode. This test power supply is independent of the operating power supply employed during the normal operation of the circuit functions of the host circuit. This separate, secondary test power supply is employed to enable and operate the test mode, and the test mode signals may be multiplexed on the power supply leads or structures, and/or separate I/O signals to effect the desired test functions. Upon completion of a test, removal of power from the test power supply effectively isolates, or open circuits, the test mode circuitry from the operating circuit of the host circuit. This isolation also prevents any subsequent failure of the test circuitry from having an effect on the operation of the host circuit.

DETAILED DESCRIPTION

Figure 1:
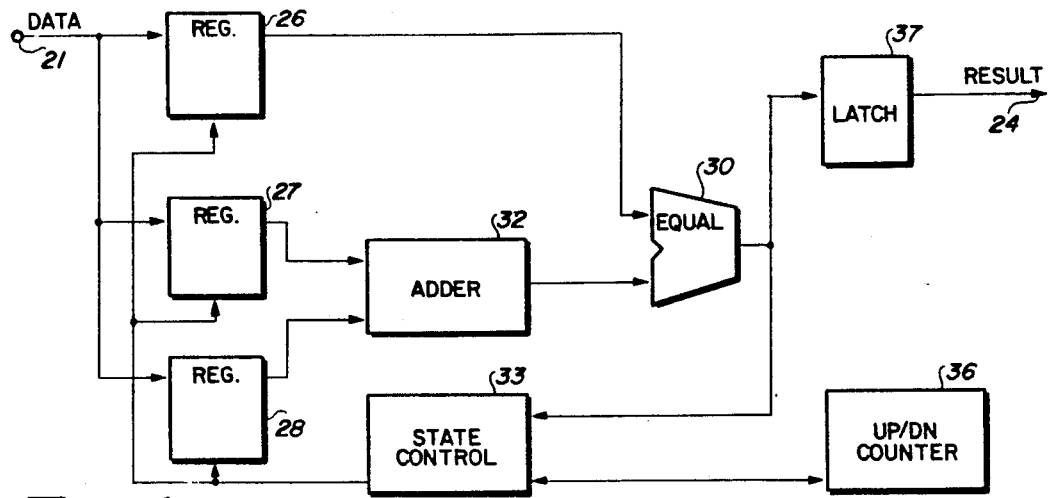
FIG. 1 is a block diagram of a typical integrated circuit function formed as a part of a host circuit on a silicon wafer.

Reference now should be made to the drawings in which the same reference numbers are used throughout the different figures to designate the same components. FIG. 1 is a block diagram illustration of a representative integrated circuit structure of the type which typically may be found as part of a larger, overall system on an integrated circuit silicon wafer. As illustrated in FIG. 1, the circuit is shown in its normal operation, without any of the self-test structure shown. Since the self-test structures of the present invention are powered up only at test time, and essentially disappear at all times except when test the mode of operation of the circuit is taking place, the circuit of FIG. 1 operates in its normal manner, irrespective of the presence of hidden, isolated test circuitry on the chip.

The circuit of FIG. 1 may be any part of a typical data processing system, and is illustrated as having a data input 21 supplied in parallel to three registers 26, 27, and 28, which may be latching circuits, bistable multi-vibrators, or other circuit devices. In the circuit illustrated in FIG. 1, the operation or state of these registers is controlled by a state control circuit 33, which controls the response of the registers 26 through 28 to the data input signals appearing on the input 21 in any desired manner.

In the circuit illustrated in FIG. 1, the outputs of the registers 27 and 28 are provided to an adder 32, which combines these outputs to produce one input to a comparator circuit 30. The output of the register 26 is connected to another input of the circuit 30, which produces an output signal supplied in parallel to one input of the state control circuit 33 and to a latch circuit 37. The latch 37 acts as a buffer between the circuit 30 and an output terminal 24. Also illustrated in FIG. 1 is an up/down digital counter 36 which supplies signals to the state control circuit 33, and which receives start, stop, and/or reset signals from the state control circuit 33, depending upon the particular circuit functions required of the circuit of FIG. 1.

For the purposes of the present discussion, the actual function of the circuit of FIG. 1, and the manner in which it carries out this function, is not important. In any integrated circuit found on a high-density silicon chip or wafer, however, it is important to be able to test the various circuit components of the host circuit to determine whether any faults, such as short circuits, open circuits and the like exist in any of the circuit components. Thus, it is necessary to be able to probe various test points of such a circuit in a "test" mode of operation.

Figure 2:
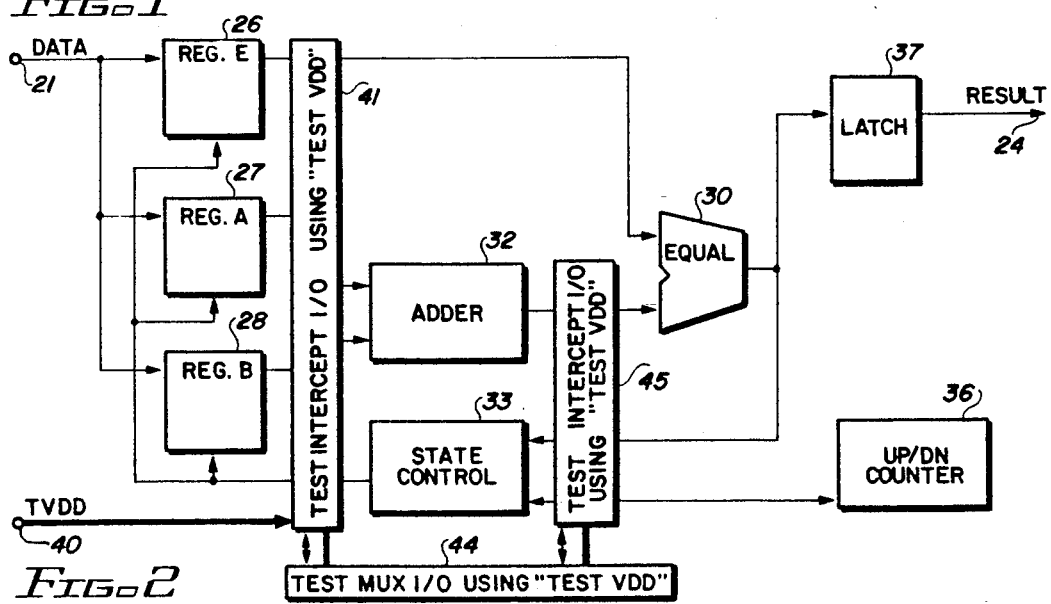
FIG. 2 is a block diagram of the circuit of FIG. 1, illustrating the effective circuit interconnections which exist during a test mode of operation of the circuit.

FIG. 2 illustrates the hidden or buried multiplex test circuitry which is utilized in conjunction with the host circuit of FIG. 1 to effect testing of the circuit under power. To accomplish this, a separate test power supply lead, connected to a test voltage terminal 40, is included in the system logic built into the host circuit of FIG. 1. This separate power supply lead and input terminal 40 are electrically isolated from the operating power supply circuit inputs for the circuit, and operate totally independently of the normal operating power supply for the circuit.

As discussed in conjunction with FIG. 1, when the normal operating power supply is applied, the circuit of FIG. 1 operates in accordance with its designed circuit functions. When the secondary test circuit power supply 40 is turned on or energized, the circuit, through the buried or hidden test circuit logic, attains the operating configuration illustrated in FIG. 2. A multiplex input/output bus 44 is created by the application of test circuit operating power voltage to the terminal 40. Test input signals and the resultant test output signals are multiplexed onto the test circuit power supply leads and/or separate I/O signals, and are supplied through intercept taps 41 and 45 to effectively electrically interconnect the test circuit to external test equipment by way of the terminal 40. The desired circuit test sequence necessary to determine the integrity of the host circuit then may be effected.

In the circuit of FIG. 2, all of the host circuit elements which are shown in FIG. 1, are provided with the same reference numbers. The difference between the representation shown in FIG. 2 and the host circuit of FIG. 1, is illustrated by the multiplex input/output intercepts 41 and 45, and by the test mulitplex bus 44, operated in conjunction with the test voltage power supply circuit energized by the application of test operating voltage to the terminal 40. The source of the test operating voltage has not been shown, since it is a common, direct current voltage obtained from a source typically used to operate integrated circuit systems of the type shown in FIG. 1. It is important to note, however, that the operating test voltage is applied to the terminal 40 only when the circuit is operated in its test mode. When this test voltage is removed, all of the intercept circuits 41 and 45, and the multiplex "bus" 44, as well as the test voltage power supply leads connected to the terminal 40 essentially become an open-circuit or "disappear"; so long as the system is operated in its normal manner. When this occurs, the system appears to have the configuration shown in FIG. 1, since the test circuitry essentially is removed. Because of the manner in which the test circuitry is interconnected, it has no effect on the reliability of the host circuit with which it is used.

Figure 3:
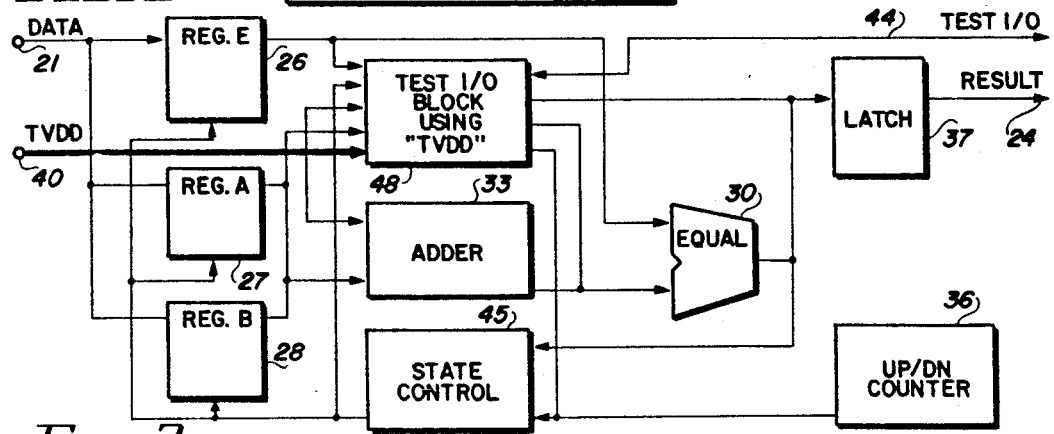
FIG. 3 is block diagram of the circuit of FIG. 1, illustrating an alternative test circuit from the one shown in FIG. 2.

FIG. 3 illustrates another configuration which may be utilized for the test circuitry. Once again, in the circuit of FIG. 3, the host circuit of FIG. 1 is employed. The circuit however, is illustrated as interconnected with a test circuit input/output block 48, which is simultaneously enabled and operated by the application of a secondary test power supply voltage applied to the terminal 40. When the test input/output block 48 is activated, the test point operating circuit connections of the circuit are as illustrated in FIG. 3. By applying multiplexed test probe signals on the test power supply lead coupled to the terminal 40, various ones of the host circuit components can be interrogated in accordance with the necessary test functions to be accomplished. Similarly, multiplex output signals as a result of these different probes, are obtained from the circuit on the leads interconnecting the block 48 to the test power supply circuit input terminal 40.

It should be noted that the built-in self-test system illustrated in FIGS. 2 and 3 is capable of sharing test resources with a host test system or a host controller. When a common test language is used, the host controller or tester may be run asynchronously to the device under test, controlling the direction of the test and soliciting responses as required. The technique also may be used for purely digital systems of the type illustrated in FIGS. 1, 2 and 3, or for analog systems, or for systems which have digital and analog interfaces. The signals for accomplishing the various test operations are determined by the nature or characteristics of the host circuit under test, but are applied to the test system by multiplexing them on the test voltage power supply terminal 40 in the manner described.

Figure 4:
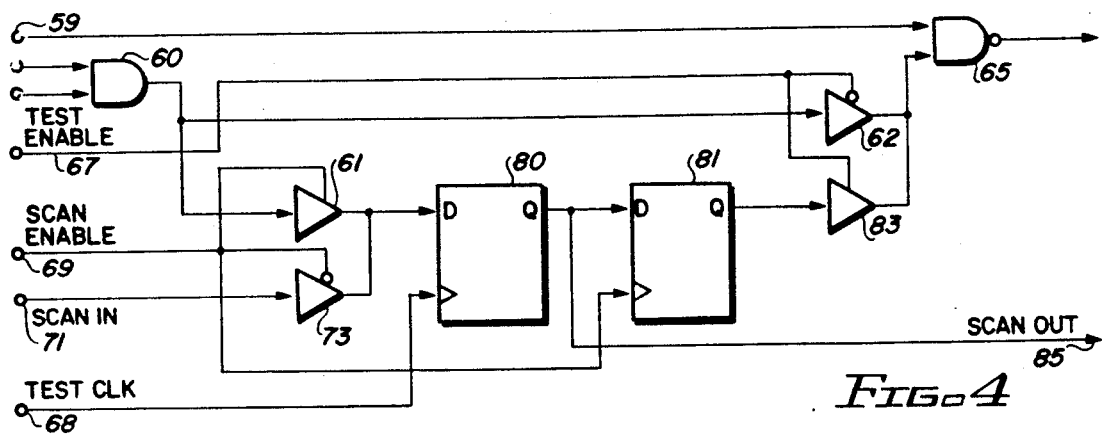
FIG. 4 is a block diagram of a functional circuit component of the type for which testing is desired.

FIG. 4 is directed to the circuit of a T-cell on an integrated circuit wafer or integrated circuit chip, showing the various circuit components for normal signal operation of the circuit. Test enable and test clock input terminals also are illustrated, along with the internal interconnections of these terminals. The circuit of FIG. 4 has a first input lead 59 which is connected to an output NAND gate 65. The other input to the NAND gate 65 is obtained from one or the other of two inverters 62 and 83, the outputs of which are connected together in common to the second input of the gate 65.

Another source of input signals for the circuit shown in FIG. 4, is obtained from an AND gate 60 which has two inputs connected to it. These inputs may be coupled to any suitable source of input signals for performing the desired function for which the circuit of FIG. 4 is designed. Coincidence of two inputs on the gate 60 produces an output signal which is supplied in parallel to the inputs of an invertor 61 and the invertor 62. As mentioned previously, the invertor 62 is coupled to one of the inputs of the NAND gate 65. The output of the invertor 61 is coupled to the trigger input of a bistable, multi-vibrator circuit 80. The output of the multi-vibrator circuit 80 is connected to the input of a cascaded bistable multi-vibrator 81, which in turn has its output connected to the input of the invertor 83. Under normal operation of the host circuit shown in FIG. 4, scan enable operating signals are applied on a terminal 69 to enable the inverters 61 and 73 for operation to respond to signals on their inputs. Scan signals are applied on terminal 71 to the invertor 73, while the input to the invertor 61 is obtained from the output of the gate 60, as described previously.

Whenever either one of the inverters 61 and 73 produces an output, a trigger pulse is applied to the multi-vibrator 80. The sequence of the operation of the cascaded multi-vibrators 80 and 81 is effected under the control of the scan enable signals applied on the terminal 69, which also is connected to the clock input of the multi-vibrator 81. The scan signal itself appears on the output of the multi-vibrator 80 and is applied to a scan output terminal 85. The specific manner in which the circuit of FIG. 4 operates is unimportant to an understanding of the overall function and operation of the built-in, self-test structure. The circuit of FIG. 4, however, is of the type which typically requires analysis during a test mode operation of the circuit.

Figure 5:
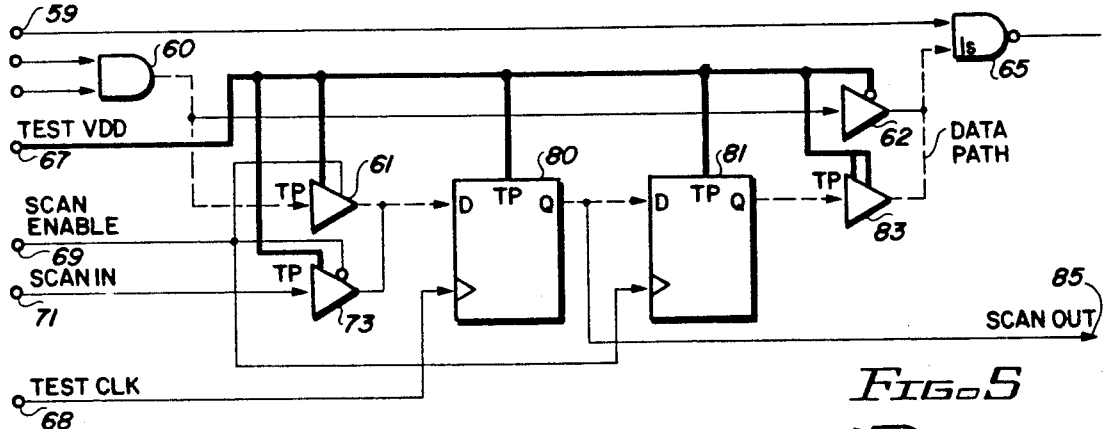
FIG. 5 is a block diagram of the circuit of FIG. 4 in the test mode of operation thereof.

Reference now should be made to FIG. 5, which essentially is a duplication of the circuit of FIG. 4, but which illustrates the configuration attained by the circuit of FIG. 4 when a test operating voltage is applied to an input terminal 67 on a test power supply input terminal or bonding pad. This enables the various test point gates of the circuit elements 61, 62, 73, 80, 81, and 83 as indicated by the heavy black lines interconnecting these various circuit elements with the test voltage input terminal 67.

The test signal data path of FIG. 5 is indicated as the dotted lines from the output of the AND gate 60, through the invertor 61 and bistable circuits 80 and 81, to the invertor 83 and finally, to the "1s" lower input of the NAND gate 65. Test clock signals are applied on a terminal 68 to achieve the necessary interrogation to determine whether the data path under test is functioning properly. It should be noted that the "1s" input of the gate 65 is a ttl input.

Figure 6:
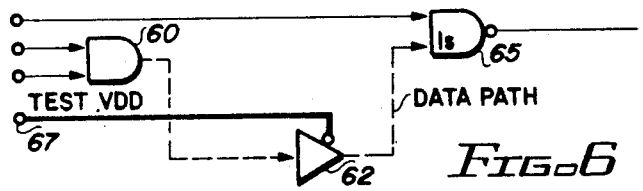
FIGS. 6 and 7 are a detailed circuit diagrams illustrating features of a preferred embodiment of the invention.

FIG. 6 illustrates the enable test function which occurs through the invertor gate 62 in the operation of that portion of the circuit of FIG. 5 when the multiplexed test point input signals select the data path which extends directly from the output of the AND gate 60 through the invertor 62 to the "1s" input of the NAND gate 65 of FIG. 5. Once again, the test input information is multiplexed on the power supply lead 67 to determine the circuit integrity of the data path illustrated in dotted lines in FIG. 6.

Figure 7:
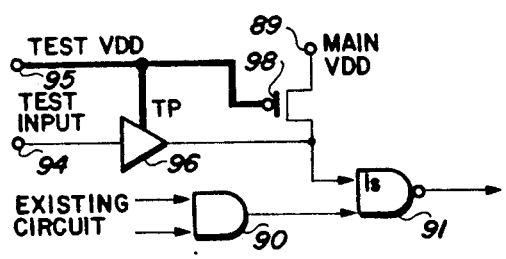

FIG. 7 illustrates the circuit configuration of a typical circuit component. A main or conventional operating power supply is applied on a terminal 89, and supplied through an MOS transistor 98 to the "1s" input of a typical NAND gate 91, for example. When there is an operating potential on the terminal 89, no operating potential is applied to a test power supply input terminal 95. Conversely, when the test mode of operation is desired, a test operating voltage is applied to the terminal 95. This blocks the transistor 98, so that test input signals applied on a terminal 94 are supplied through an enabled test invertor 96 to the "1s" input of the gate 91. The other input to the gate 91 is obtained from the output of an AND gate 90 in the existing host circuit.

When the circuit of FIG. 7 is returned to its normal operating mode, the test voltage is removed from the terminal 95. This effectively removes the invertor 96 from the circuit, and the "1s" input of the NAND gate 91 is enabled by the operating power supplied through the transistor 98 from the terminal 89.

Figure 8:
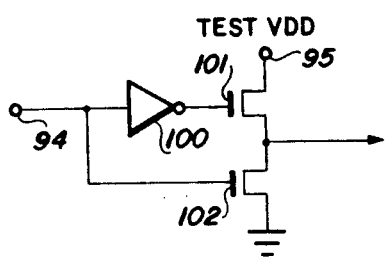

FIG. 8 is a detailed diagram of the circuit configuration of the output structure of the invertor 96, illustrated in FIG. 7. The test input terminal 94 and the test power supply terminal 95 of FIG. 8 correspond to those same terminals of FIG. 7. A pair of MOS transistors 101 and 102, are connected in series between the terminal 95 and ground. The output for the circuit (applied to the "1s" input of the gate 91 in FIG. 7) is obtained from the junction between the two transistors 101 and 102. The gate of the transistor 101 is controlled by the output of an invertor 100, and the gate of the transistor 102 is controlled by the signals directly applied to the terminal 94 to control the signals applied to the "1s" input of the gate 91 in a conventional manner.

Figure 9:
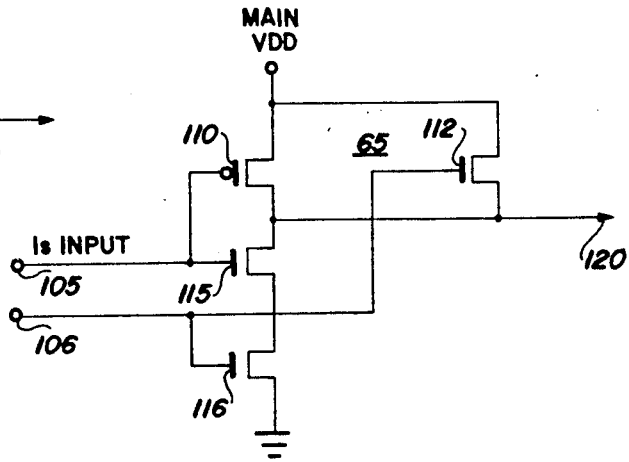
FIGS. 8 and 9 are detailed circuit diagrams of circuit components of the type used in the systems illustrated in FIGS. 1 through 5.

FIG. 9 illustrates a typical NAND gate of the type illustrated for the gates 65 and 91 of FIGS. 4 through 7. This NAND gate has one "1s" input 105 and a second input 106. The gate itself consists of a pair of complimentary MOS transistors 110 and 115 connected in series with an MOS transistor 116 of the same type as the transistor 115. The output of the gate is applied on a terminal 120, which is connected to the junction between the transistors 110 and 115, and also to a second MOS transistor 112 of the same type as the transistor 110. The operation of this NAND gate is conventional, and is illustrated in detail to provide an understanding of the circuit interconnections of the NAND gates 65 and 91, which have been discussed above.

It should be noted that the test circuits, which have been described in conjunction with the various host circuits, automatically power down and disconnect, or essentially disappear whenever the secondary test power supply is removed from, or disconnected from, the test power supply input terminal (40,67 or 95). This is in contrast with standard test circuitry for integrated circuit wafers, where the test circuitry is always powered up, but then is operated subsequently by test "enable" circuitry. In the built-in, self-test structures which have been described above, and which are shown in the drawings, the application of a test power voltage to the various test power supply input terminals simultaneously enables and permits operation of the test mode. The various test signals may be applied to the circuit by way of multiplex terminals or on separate test input terminals. In either event, removal of the test circuit operating power, which is completely independent of the normal operating power for the host circuit, causes the test circuits to be electrically, completely removed from the host system. As a consequence, failure of any part of the test circuit has no effect on the operation of the host circuit, if such failure should subsequently occur after the host circuit is placed in operation.

Various changes and modifications will occur to those skilled in the art, without departing from the scope of this invention as defined in the appended claims. For example, the particular host circuit configurations which have been illustrated, have been chosen purely for the purposes of illustration and are not to be considered in any way as limiting of the application or configuration of the test circuit interconnections. A variety of different circuit functions and types of circuits may be employed, using the test circuit structures and operating techniques which have been described.

I claim:

1. A built-in, self-test structure for an integrated circuit chip having a plurality of circuit components thereon, said chip having an operating power supply and operating data and control circuit interconnections for the circuit components thereon, said self-test structure including in combination:

test power supply circuit means on said chip and interconnected with circuit components of said chip, said test power supply circuit means being separate from, and independent of, the operating power supply and the operating power supply circuit interconnections for the circuit components of said integrated circuit chip; and test point connection means on at least some of the circuit components of said integrated circuit chip and coupled to said test power supply circuit means for enabling such circuit components for circuit test operation of said integrated circuit chip when power is supplied thereto from said test power supply circuit means instead of from said operating power supply, wherein said test power supply circuit means is electrically isolated from the circuit components of said integrated circuit chip in the absence of the application of power thereto.

2. The combination according to claim 1 wherein said test power supply circuit means comprises separate test power supply leads isolated from the operating power supply and operating circuit interconnections; and said test power supply leads are open circuited in the absence of the application of test power thereto.

3. The combination according to claim 2 wherein said test power supply circuit means simultaneously enable and operate the components of said integrated circuit in a test mode by multiplexing test input, and said test power supply together.

4. The combination according to claim 3 further including means for multiplexing test input signals and test operating power on said test power supply circuit means when test operating power is applied thereto.

5. The combination according to claim 1 wherein said test power supply circuit means simultaneously enable and operate the components of said integrated circuit in a test mode by multiplexing test input, and said test power supply together.

6. The combination according to claim 1 further including means for multiplexing test input and output signals and test operating power on said test power supply circuit means when test operating power is applied thereto.

* * * * *